(12) United States Patent
Nakamura et al.

(10) Patent No.: US 12,291,605 B2
(45) Date of Patent: *May 6, 2025

(54) COMPOSITE STRUCTURE AND MANUFACTURING METHOD THEREOF

(71) Applicant: DIC Corporation, Tokyo (JP)

(72) Inventors: Kenji Nakamura, Ichihara (JP); Tomomichi Kanda, Ichihara (JP)

(73) Assignee: DIC Corporation, Tokyo (JP)

( * ) Notice: Subject to any disclaimer, the term of this patent is extended or adjusted under 35 U.S.C. 154(b) by 174 days.

This patent is subject to a terminal disclaimer.

(21) Appl. No.: 17/788,367

(22) PCT Filed: Dec. 11, 2020

(86) PCT No.: PCT/JP2020/046336
§ 371 (c)(1),
(2) Date: Jun. 23, 2022

(87) PCT Pub. No.: WO2021/131804
PCT Pub. Date: Jul. 1, 2021

(65) Prior Publication Data
US 2023/0040667 A1 Feb. 9, 2023

(30) Foreign Application Priority Data
Dec. 27, 2019 (JP) .................. 2019-238247

(51) Int. Cl.
| | | |
|---|---|---|
| C08G 75/0259 | (2016.01) |
| B29C 45/14 | (2006.01) |
| B29K 81/00 | (2006.01) |
| B29K 705/02 | (2006.01) |
| B32B 3/26 | (2006.01) |
| B32B 15/08 | (2006.01) |
| B32B 15/20 | (2006.01) |
| C08G 75/0281 | (2016.01) |
| C08K 5/54 | (2006.01) |

(52) U.S. Cl.
CPC ............ *C08G 75/0259* (2013.01); *B32B 3/26* (2013.01); *B32B 15/08* (2013.01); *B32B 15/20* (2013.01); *C08G 75/0281* (2013.01); *C08K 5/54* (2013.01); *B29C 45/14311* (2013.01); *B29K 2081/00* (2013.01); *B29K 2705/02* (2013.01); *B32B 2266/045* (2013.01); *B32B 2266/104* (2016.11)

(58) Field of Classification Search
CPC ...... B29C 2045/14327; B29C 37/0078; B29C 45/0001; B29C 45/14311; B29C 70/003; B29C 70/88; B29C 2081/00; B29K 2705/02; B32B 15/08; B32B 15/20; C08G 75/0259; C08G 75/0281; C08K 3/013; C08K 5/54; C08K 5/5435; C08K 7/14; C08L 23/0884; C08L 81/02; C08L 81/04; H05K 1/0333; H05K 2201/09118; H05K 3/0014; H05K 3/383; H05K 3/385; H05K 1/0201; H05K 1/0306; H05K 1/16; H05K 3/3431; Y02E 60/10

See application file for complete search history.

(56) References Cited

U.S. PATENT DOCUMENTS

| | | |
|---|---|---|
| 8,883,959 B2 | 11/2014 | Hinokimori |
| 2011/0319587 A1 | 12/2011 | Hinokimori |
| 2014/0128568 A1 | 5/2014 | Hinokimori |
| 2016/0194779 A1 | 7/2016 | Umemoto et al. |
| 2016/0221301 A1 | 8/2016 | Okumura et al. |
| 2017/0313880 A1* | 11/2017 | Yamada ................. C09J 183/04 |
| 2019/0159352 A1* | 5/2019 | Sun ..................... H04M 1/0283 |
| 2021/0162680 A1 | 6/2021 | Nakamura et al. |

FOREIGN PATENT DOCUMENTS

| | | |
|---|---|---|
| EP | 3575077 A1 | 12/2019 |
| JP | 2007-050630 A | 3/2007 |
| JP | 2016-522310 A | 7/2016 |
| JP | 2018-199250 A | 12/2018 |
| JP | 2019-010816 A | 1/2019 |
| JP | 2019-111790 A | 7/2019 |
| WO | 2009/031632 A1 | 3/2009 |
| WO | 2010/058713 A1 | 5/2010 |
| WO | 2013/128595 A1 | 9/2013 |
| WO | 2014/157289 A1 | 10/2014 |
| WO | 2015/037718 A1 | 3/2015 |
| WO | 2019/198610 A1 | 10/2019 |

* cited by examiner

*Primary Examiner* — Hai Vo
(74) *Attorney, Agent, or Firm* — Troutman Pepper Locke LLP; James E. Armstrong, IV; Nicholas J. DiCeglie, Jr.

(57) ABSTRACT

The invention is directed to a composite structure in which a metal member having a roughened surface and a resin member are joined in a state in which at least a portion of the roughened surface is included. The resin member is made of a molded article obtained by melt-molding a polyarylene sulfide resin composition containing a polyarylene sulfide resin. In the roughened surface, a cumulative pore volume of a pore diameter in a range of 0.1 μm to 20 μm is in a range of 0.5 nL/mm² or more and 5 nL/mm² or less measured by mercury porosimetry. According to the invention, it is possible to provide a composite structure that is obtained by joining a metal member and a molded article made of polyarylene sulfide resin composition and is more excellent in joining strength, heat cycle resistance, and sealing properties, and a method for producing the composite structure.

12 Claims, No Drawings

COMPOSITE STRUCTURE AND MANUFACTURING METHOD THEREOF

TECHNICAL FIELD

The present invention relates to a composite structure in which a molded article obtained by melt-molding a polyarylene sulfide resin composition and a metal member having a roughened surface are joined to each other, and a method for producing the same.

BACKGROUND ART

It is known that a polyarylene sulfide (hereinafter, sometimes abbreviated as "PAS") resin represented by a polyphenylene sulfide (hereinafter, sometimes abbreviated as "PPS") resin is capable of retaining a melting point of 270° C. or higher, exhibits excellent heat resistance, and is also excellent in mechanical strength, chemical resistance, molding processability, and dimensional stability. Here, a PAS resin composition is obtained by blending additives such as a reinforcing filler and an elastomer to the PAS resin and melt-kneading the mixture such that these additives are dispersed in a matrix made of the PAS resin, and the PAS resin composition is melt-molded to be processed into various molded articles such as electric and electronic equipment parts and automobile parts.

High heat-resistance resin members such as PAS resins are used as alternatives for metal members from the viewpoint of weight reduction of various parts. However, when it is difficult to replace all metal members with a resin member due to problems such as mechanical strength, a composite structure obtained by joining and integrating a metal member and the resin member is used.

As such a composite structure, for example, there is known a method in which the surface of a metal member is roughened, and then joining is performed using a resin composition by an anchor effect. For example, there is a composite structure that is obtained by preparing an aluminum alloy or a magnesium alloy having concave portions in the order of nanometer to micrometer on a metal surface by a chemical treatment using an erosive aqueous solution or an erosive suspension or the chemical treatment in combination with an anodic oxidation method, injection-molding a resin composition on the aluminum alloy or the magnesium alloy to fix the resin composition in a state of penetrating the roughened concave portions (see PTL 1 to PTL 4).

The joining strength, the heat cycle resistance, and the sealing properties of the composite structure prepared by such a method depend on the uneven shape of the metal surface and the type of the resin, and are not sufficient for being adopted for various molded articles such as electric and electronic equipment parts and automobile parts. Therefore, it is desired to develop a metal-resin composite structure having more excellent joining strength, heat cycle resistance, and sealing properties.

CITATION LIST

Patent Literature

PTL 1: WO 2013/128595
PTL 2: JP-A-2007-050630
PTL 3: WO 2009/031632
PTL 4: WO 2015/037718

SUMMARY OF INVENTION

Technical Problem

Accordingly, an object of the invention is to provide a composite structure that is obtained by joining a metal member and a molded article made of a polyarylene sulfide resin composition and is more excellent in joining strength, heat cycle resistance, and sealing properties, and a method for producing the same.

Solution to Problem

Therefore, the present inventors have intensively studied, and as a result, have noticed that it is possible to provide a composite structure excellent in joining strength, heat cycle resistance, and sealing properties by focusing on a polyarylene sulfide resin and a cumulative pore volume as the uneven shape of a metal surface suitable for the polyarylene sulfide resin and setting the cumulative pore volume in an interface between the polyarylene sulfide resin and the metal surface within a specific range. Thus, the invention has been completed.

That is, the invention is directed to a composite structure in which a metal member having a roughened surface and a resin member are joined in a state in which at least a portion of the roughened surface is included. The resin member is made of a molded article obtained by melt-molding a polyarylene sulfide resin composition containing a polyarylene sulfide resin. The roughened surface has a cumulative pore volume in a range of 0.5 $nL/mm^2$ or more and 5 $nL/mm^2$ or less in a range of a pore diameter of 0.1 μm to 20 μm measured by mercury porosimetry.

Advantageous Effects of Invention

According to the invention, it is possible to provide a composite structure in which a metal member and a molded article made of a polyarylene sulfide resin composition are joined and which is more excellent in joining strength, heat cycle resistance, and sealing properties, and a method for producing the same.

DESCRIPTION OF EMBODIMENTS

<Composite Structure>

In a composite structure according to the invention, a metal member (1) having a roughened surface and a resin member are joined in a state in which at least a portion of the roughened surface is included, the resin member being made of a molded article (2) obtained by melt-molding a polyarylene sulfide resin composition containing a polyarylene sulfide resin. At least a part of a surface roughened portion (surface-roughened portion) of the metal member (1) and the molded article (2) are joined to each other as a joining surface (3). In the roughened surface of the composite structure, the cumulative pore volume of the pore diameter in the range of 0.1 μm to 20 μm is in the range of 0.5 $nL/mm^2$ or more and 5 $nL/mm^2$ or less measured by mercury porosimetry.

[Metal Member (1)]

Hereinafter, the metal member (1) having a roughened surface will be described.

(Type of Metal)

A known metal member can be used regardless of the type thereof. That is, examples of the metal member include aluminum, copper, stainless steel, magnesium, iron, titanium, and alloys containing these metals. More specifically, examples of the metal member include: iron, or an alloy containing iron as a main component, that is, a ratio of 20 mass % or more, more preferably 50 mass % or more, and still more preferably 80 mass %, and further containing carbon, silicon, manganese, chromium, tungsten, molybdenum, phosphor, titanium, vanadium, nickel, zirconium, boron, and the like (hereinafter, referred as to an iron alloy) such as stainless steel and steel; aluminum or an alloy containing aluminum as a main component and further containing copper, manganese, silicon, magnesium, zinc, and nickel (hereinafter, referred to as an aluminum alloy); magnesium or an alloy containing magnesium as a main component and further containing zinc, aluminum, zirconium, and the like (hereinafter, referred to as a magnesium alloy); copper or an alloy containing copper as a main component and further containing zinc, tin, phosphorus, nickel, magnesium, silicon, and chromium (hereinafter, referred to as a copper alloy); and titanium or an alloy containing titanium as a main component and further containing copper, manganese, silicon, magnesium, zinc, and nickel (hereinafter, referred to as a titanium alloy). Among these, more preferred are iron, an iron alloy, an aluminum alloy, a magnesium alloy, a copper alloy, and a titanium alloy, and still more preferred are an iron alloy, an aluminum alloy, and a magnesium alloy.

[Method for Roughening Surface]

In addition, when the cumulative pore volume of the pore diameter in the range of 0.1 μm to 20 μm in the roughened surface of the composite structure measured by the mercury porosimetry can be adjusted in a predetermined range, it is possible to use a known method for roughening the surface of the metal member, for example, (1) an immersion method using an erosive aqueous solution or an erosive suspension, (2) an anodic oxidation method, and (3) mechanical cutting by blasting or laser processing.

As a roughening method capable of adjusting, in a predetermined range, the cumulative pore volume of the pore diameter in the range of 0.1 μm to 20 μm in the roughened surface of the composite structure measured by the mercury porosimetry, (1) the immersion method using an erosive aqueous solution or an erosive suspension or (2) the anodic oxidation method is particularly preferred.

Before the fine uneven surface is formed, the metal member is preferably processed into a predetermined shape by plastic processing by cutting, pressing, and the like, punching, and thinning by cutting, grinding, and discharge processing.

Note that a primer layer may be formed on the surface of the metal member in which the metal is subjected to a surface treatment. The material constituting the primer layer is not particularly limited, and the primer layer is usually made of a primer resin material containing a resin component. The primer resin material is not particularly limited, and a known primer resin material can be used. Specific examples of the primer resin material include a known polyolefin-based primer, epoxy-based primer, and urethane-based primer. A method for forming the primer layer is not particularly limited, and the primer layer can be formed by coating the metal member subjected to the surface treatment with a solution of the primer resin material or an emulsion of the primer resin material. Examples of a solvent used for preparing the solution include toluene, methyl ethyl ketone (MEK), and dimethyl phosphoramide (DMF). Examples of a medium for the emulsion include an aliphatic hydrocarbon medium and water.

[Evaluation of Cumulative Pore Volume in Roughened Surface of Metal Surface]

(Mercury Porosimetry)

From the viewpoint of improving the joining strength between the metal member and the resin member, in the roughened surface, the cumulative pore volume of the pore diameter in the range of 0.1 μm to 20 μm measured by the mercury porosimetry is in the range of 0.5 nL/mm$^2$ or more, preferably 0.8 nL/mm$^2$ or more, and more preferably 1 nL/mm$^2$ or more and 5 nL/mm$^2$ or less, preferably 4 nL/mm$^2$ or less, and more preferably 3 nL/mm$^2$ or less.

The mercury porosimetry is defined in JIS R 1655:2003. Examples of a mercury porosimeter that can be used in measuring the pore distribution by the mercury porosimetry include PASCAL 240 manufactured by MicrotracBEL Corporation.

Note that when a metal material of the roughened surface is a metal (for example, aluminum, an aluminum alloy, lead, tin, or a tin alloy) for forming an amalgam with mercury, the roughened surface is subjected to a sputtering treatment with gold or platinum before the cumulative pore volume is evaluated. The thickness in the sputtering treatment is in the range of preferably 30 nm or more, more preferably 40 nm or more, and preferably 70 nm or less, more preferably 50 nm or less.

From the viewpoint of improving the joining strength between the metal member and the resin member, in the roughened surface, the pore diameter in which the pore distribution shows the maximum value of the pore diameter in the range of 0.1 μm to 20 μm measured by the mercury porosimetry is preferably 5 μm or less, and more preferably 3 μm or less.

(Nitrogen Gas Adsorption Method)

From the viewpoint of improving the joining strength between the metal member and the resin member, the cumulative pore volume in the roughened surface is preferably less than 10 nL/mm$^2$, and more preferably less than 5 nL/mm$^2$, measured by the nitrogen gas adsorption method.

The nitrogen gas adsorption method is defined in JIS Z 8830:2013. Examples of a specific surface area measurement device that can be used in measuring the pore distribution by the nitrogen gas adsorption method include BEL-SORP-maxII manufactured by MicrotracBEL Corporation.

Note that in the present description, the pore distribution, the maximum value, and the cumulative pore volume of the pore diameter in specific ranges are determined by methods described in Examples.

[Resin Member (2)]

The resin member (2) used in the invention is made of a molded article obtained by melt-molding a polyarylene sulfide resin composition containing a polyarylene sulfide resin. First, the polyarylene sulfide resin composition containing the polyarylene sulfide resin, which is a component element of the composite structure, will be described.

The polyarylene sulfide resin composition used in the invention is obtained by blending the polyarylene sulfide resin as an essential component with other components as necessary and melt-kneading the mixture.

The polyarylene sulfide resin used in the invention has a resin structure having, as a repeating unit, a structure in which an aromatic ring and a sulfur atom are bonded to each other, and specifically is a resin having, as a repeating unit, a structural moiety represented by the following General Formula (1) and a trifunctional structural moiety represented by the following General Formula (2) as necessary.

[Chem. 1]

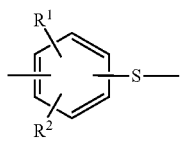

Formula (1)

(In the formula, $R^1$ and $R^2$ each independently represent a hydrogen atom, an alkyl group having 1 to 4 carbon atoms, a nitro group, an amino group, a phenyl group, a methoxy group, or an ethoxy group.)

[Chem. 2]

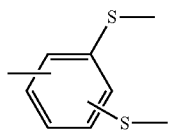

Formula (2)

The trifunctional structural moiety represented by the Formula (2) is preferably in the range of 0.001 mol % to 3 mol %, and particularly preferably in the range of 0.01 mol % to 1 mol %, relative to the total number of moles with other structural moieties.

Here, the structural moiety represented by the above General Formula (2), in particular, $R^1$ and $R^2$ in the formula is preferably a hydrogen atom from the viewpoint of the mechanical strength of the polyarylene sulfide resin. In this case, examples thereof include a moiety bonded at a para position represented by the following Formula (3) and a moiety bonded at a meta position represented by the following Formula (4).

[Chem. 3]

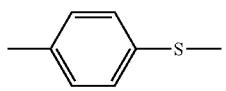

Formula (3)

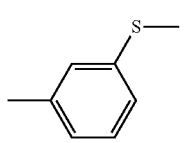

Formula (4)

Among these, in particular, a bond of the sulfur atom to the aromatic ring in the repeating unit is preferably a structure bonded at the para position represented by the above General Formula (3) from the viewpoint of the heat resistance and the crystallinity of the polyarylene sulfide resin.

In addition, the polyarylene sulfide resin may have not only the structural moieties represented by the above General Formulas (1) and (2) but also have structural moieties represented by the following Structural Formulas (5) to (8) in an amount of 30 mol % or less of the total of the structural moieties represented by the General Formula (1) and the General Formula (2).

[Chem. 4]

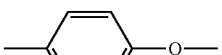

Formula (5)

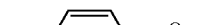

Formula (6)

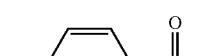

Formula (7)

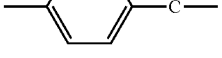

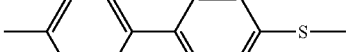

Formula (8)

In particular, in the invention, the structural moieties represented by the above General Formulas (5) to (8) are preferably 10 mol % or less from the viewpoint of the heat resistance and the mechanical strength of the polyarylene sulfide resin. When the polyarylene sulfide resin contains the structural moieties represented by the above General Formulas (5) to (8), the bonding form thereof may be any of a random copolymer and a block copolymer.

In addition, the polyarylene sulfide resin may have a naphthyl sulfide bond in the molecular structure thereof, which is preferably 3 mol % or less, and particularly preferably 1 mol % or less relative to the total number of moles with the other structural moieties.

(Melt Viscosity)

The melt viscosity (V6) measured at 300° C. of the polyarylene sulfide resin used in the invention is in the range of preferably 5 (Pa·s) or more, more preferably 10 (Pa·s) or more, and preferably 500 (Pa·s) or less, more preferably 100 Pa·s or less. With this range, the polyarylene sulfide resin is more excellent in joining strength when the resin member (2) is joined to the metal member (1) having the roughened surface. Here, in the invention, the melt viscosity (V6) is a value obtained by measuring the melt viscosity using a Koka flow tester after the polyarylene sulfide resin is held at 300° C., a load of $1.96 \times 10^6$ Pa, and L/D=10 (mm)/1 (mm) for 6 minutes.

In addition, other physical properties of the polyarylene sulfide resin are not particularly limited as long as effects of the invention are not impaired, and are as follows.

(Melting Point (Tm) and Recrystallization Temperature (Tc2))

Since the polyarylene sulfide resin composition excellent in heat resistance and mechanical strength needs to be obtained, the melting point (Tm) of the polyarylene sulfide resin is preferably in the range of 270° C. or higher, and is more preferably in the range of 270° C. to 300° C. In addition, since the polyarylene sulfide resin composition excellent in heat resistance and mechanical strength needs to be obtained, the recrystallization temperature (Tc2) of the polyarylene sulfide resin is preferably in the range of 200° C. to 260° C.

(Non-Newtonian Index)

The non-Newtonian index of the polyarylene sulfide resin used in the invention is not particularly limited as long as the effects of the invention are not impaired, and is preferably in the range of 0.90 to 2.00. When a linear polyarylene sulfide resin is used, the non-Newtonian index is preferably in the range of 0.90 to 1.50, and is more preferably in the range of 0.95 to 1.20. Such a polyarylene sulfide resin is excellent in mechanical properties, fluidity, and abrasion resistance. Here, the non-Newtonian index (N value) is a value calculated by measuring the shear rate and the shear stress using a Capilograph under conditions of 300° C. and a ratio of the orifice length (L) to the orifice diameter (D), i.e., L/D=40, and using the following equation.

$$SR = K \cdot SS^N \quad \text{[Math. 1]}$$

[Here, SR represents the shear rate ($s^{-1}$), SS represents the shear stress ($dyn/cm^2$), and K represents a constant.] This equation indicates that as the N value is closer to 1, PPS is closer to a linear shape, and as the N value is higher, branching proceeds.

(Production Method)

The method for producing the polyarylene sulfide resin is not particularly limited, and examples thereof include a method 1) of polymerizing a dihalogen aromatic compound in the presence of sulfur and sodium carbonate and if necessary adding a polyhalogen aromatic compound or other copolymerization components, a method 2) of polymerizing a dihalogen aromatic compound in a polar solvent in the presence of a sulfide agent and the like and if necessary adding a polyhalogen aromatic compound or other copolymerization components, a method 3) of self-condensing p-chlorothiophenol and if necessary adding other copolymerization components, and a method 4) of melt-polymerizing a diiodoaromatic substance and elemental sulfur under a reduced pressure in the presence of a polymerization inhibitor which may have a functional group such as a carboxyl group or an amino group. Among these methods, the method 2) is generally used and preferred. In the reaction, an alkali metal salt of a carboxylic acid or a sulfonic acid, or an alkali hydroxide may be added in order to adjust the degree of polymerization. In the above method 2), a polyarylene sulfide resin is preferably obtained by a method for producing a polyarylene sulfide resin by introducing a hydrated sulfide agent in a mixture containing a heated organic polar solvent and dihalogen aromatic compound at a rate at which water can be removed from a reaction mixture and adding a dihalogen aromatic compound and a sulfide agent, and a polyhalogen aromatic compound if necessary in the organic polar solvent to cause a reaction and by controlling the moisture content in the reaction system to the range of 0.02 mol to 0.5 mol relative to 1 mol of the organic polar solvent (see JP-A-H07-228699) and a method of adding a dihalogen aromatic compound and if necessary a polyhalogen aromatic compound or other copolymerization components in the presence of a solid alkali metal sulfide and an aprotic polar organic solvent and reacting an alkali metal hydrosulfide and an organic acid alkali metal salt while controlling the organic acid alkali metal salt in the range of 0.01 mol to 0.9 mol relative to 1 mol of a sulfur source and the moisture content in the reaction system to the range of 0.02 mol or less relative to 1 mol of the aprotic polar organic solvent (see WO 2010/058713). Specific examples of the dihalogen aromatic compound include p-dihalobenzene, m-dihalobenzene, o-dihalobenzene, 2,5-dihalotoluene, 1,4-dihalonaphthalene, 1-methoxy-2,5-dihalobenzene, 4,4'-dihalobiphenyl, 3,5-dihalobenzoic acid, 2,4-dihalobenzoic acid, 2,5-dihalonitrobenzene, 2,4-dihalonitrobenzene, 2,4-dihaloanisole, p,p'-dihalodiphenyl ether, 4,4'-dihalobenzophenone, 4,4'-dihalodiphenyl sulfone, 4,4'-dihalodiphenyl sulfoxide, 4,4'-dihalodiphenyl sulfide, and a compound having an alkyl group having 1 to 18 carbon atoms in an aromatic ring of each of the above compounds. Examples of the polyhalogen aromatic compound include 1,2,3-trihalobenzene, 1,2,4-trihalobenzene, 1,3,5-trihalobenzene, 1,2,3,5-tetrahalobenzene, 1,2,4,5-tetrahalobenzene, and 1,4,6-trihalonaphthalene. In addition, a halogen atom contained in each of the above compounds is preferably a chlorine atom or a bromine atom.

A post-treatment method for the reaction mixture containing the polyarylene sulfide resin obtained by a polymerization step is not particularly limited, and examples thereof include a method (1) in which after the completion of the polymerization reaction, first, the reaction mixture is used as it is, or is added with an acid or a base, and then the solvent is distilled off under a reduced pressure or normal pressure, and next, a solid after the solvent distillation is washed once or twice or more with a solvent such as water, a reaction solvent (or an organic solvent having the same solubility for a low-molecular weight polymer), acetone, methyl ethyl ketone, and an alcohol, and further neutralized, washed with water, filtered, and dried, a method (2) of adding, after the competition of the polymerization reaction, a solvent such as water, acetone, methyl ethyl ketone, an alcohol, an ether, halogenated hydrocarbon, aromatic hydrocarbon, and aliphatic hydrocarbon (a solvent which is soluble in a polymerization solvent used and is a poor solvent for at least polyarylene sulfide) as a precipitating agent to the reaction mixture to precipitate a solid product such as polyarylene sulfide or an inorganic salt, and filtering, washing, and drying the solid product, a method (3) in which after the completion of the polymerization reaction, a reaction solvent (or an organic solvent having the same solubility for a low molecular weight polymer) is added to the reaction mixture, followed by stirring, filtration to remove a low-molecular polymer, washing with a solvent such as water, acetone, methyl ethyl ketone, or an alcohol once or twice or more, neutralization, washing with water, filtration, and drying, a method (4) in which after the completion of the polymerization reaction, the reaction mixture is added with water and is washed with water, filtered, and if necessary is subjected to an acid treatment by adding an acid during the washing with water, and is dried, and a method (5) in which after the completion of the polymerization reaction, the reaction mixture is filtered, washed once or twice or more by a reaction solvent if necessary, and further washed with water, filtered, and dried.

In the post-treatment methods as exemplified in (1) to (5) described above, the polyarylene sulfide resin may be dried in a vacuum, in air, or in an inert gas atmosphere such as nitrogen.

(Melt Viscosity of Polyarylene Sulfide Resin Composition)

The melt viscosity measured at 300° C. of the polyarylene sulfide resin composition according to the invention is in the range of preferably 100 (Pa·s) or more, more preferably 150 (Pa·s) or more, and preferably 7000 Pa·s or less, more preferably 6000 (Pa·s) or less at a shear rate of 12/s, and is in the range of preferably 40 Pa·s or more, more preferably 50 (Pa·s) or more, and preferably 800 (Pa·s) or less, more preferably 700 (Pa·s) or less at a shear rate of 1200/s. Within the range, the joining strength is more excellent when the resin member (2) is joined to the metal member (1) having the roughened surface.

The polyarylene sulfide resin composition according to the invention can be blended with a filler (B) as an optional component and melt-kneaded, as necessary. As such a filler, a commonly used material can be used as long as the effects of the invention are not impaired, and examples thereof include fillers having various shapes such as fibrous fillers and non-fibrous fillers such as granular fillers and plate-shaped fillers. Specifically, fibrous fillers such as a natural fiber, and fibers such as a glass fiber, a carbon fiber, a silane glass fiber, a ceramic fiber, an aramid fiber, a metal fiber, potassium titanate, silicon carbide, calcium silicate, and wollastonite can be used, and non-fibrous fillers such as a glass bead, a glass flake, barium sulfate, clay, pyrophyllite, bentonite, sericite, mica, mica, talc, attapulgite, ferrite, calcium silicate, calcium carbonate, magnesium carbonate, a glass bead, zeolite, a milled fiber, and calcium sulfate also can be used.

When the above filler is blended, the blending ratio thereof is not particularly limited as long as the effects of the invention are not impaired, varies depending on respective purposes, and cannot be roughly specified. For example, the blending ratio is preferably in the range of 1 part by mass to 150 parts by mass, and more preferably in the range of 10 parts by mass to 100 parts by mass, relative to 100 parts by mass of the polyarylene sulfide resin. This range is preferred since the resin composition can exhibit good mechanical strength and moldability.

In addition, the polyarylene sulfide resin composition according to the invention can also be blended with an elastomer (C) as an optional component and melt-kneaded, as necessary. Examples of the elastomer (C) include thermoplastic elastomers such as a polyolefin-based elastomer, a fluorine-based elastomer, and a silicone-based elastomer. When the above elastomers are blended, the blending ratio thereof is not particularly limited as long as the effects of the invention are not impaired, varies depending on respective purposes, and cannot be roughly specified. For example, the blending ratio is preferably in the range of 0.01 parts by mass to 30 parts by mass, and more preferably in the range of 0.1 parts by mass to 15 parts by mass, relative to 100 parts by mass of the polyarylene sulfide resin. This range is preferred since the impact resistance of the obtained polyarylene sulfide resin composition can be improved.

In addition, the polyarylene sulfide resin composition according to the invention can also be blended with a silane coupling agent (D) as an optional component and melt-kneaded, as necessary. The silane coupling agent (D) is not particularly limited, and preferred examples thereof include a silane coupling agent having an epoxy group, an isocyanato group, an amino group, or a hydroxy group. Examples of such a silane coupling agent include epoxy group-containing alkoxysilane compounds such as γ-glycidoxypropyltrimethoxysilane, γ-glycidoxypropyltriethoxysilane, and β-(3,4-epoxycyclohexyl) ethyltrimethoxysilane, isocyanato group-containing alkoxysilane compounds such as γ-isocyanatopropyltrimethoxysilane, γ-isocyanatopropyltriethoxysilane, γ-isocyanatopropylmethyldimethoxysilane, γ-isocyanatopropylmethyldiethoxysilane, γ-isocyanatopropylethyldimethoxysilane, γ-isocyanatopropylethyldiethoxysilane, and γ-isocyanatopropyltrichlorosilane, amino group-containing alkoxysilane compounds such as γ-(2-aminoethyl)aminopropylmethyldimethoxysilane, γ-(2-aminoethyl)aminopropyltrimethoxysilane, and γ-aminopropyltrimethoxysilane, and hydroxy group-containing alkoxysilane compounds such as γ-hydroxypropyltrimethoxysilane and γ-hydroxypropyltriethoxysilane. The silane coupling agent is preferably in the range of 0.01 parts by mass to 5 parts by mass, and more preferably 0.1 parts by mass to 2 parts by mass, relative to 100 parts by mass of the polyarylene sulfide resin. This range is preferred since the mechanical strength and the joining strength of the obtained polyarylene sulfide resin composition can be improved.

Further, the polyarylene sulfide resin composition according to the invention can also be blended with a phenol resin as an optional component and melt-kneaded, as necessary. The phenol resin refers to a thermoplastic polymer having a phenol skeleton. Any of a novolac type phenol resin and a bisphenol type phenol resin can be preferably used, and a novolac type phenol resin is more preferred.

The hydroxyl group equivalent of the phenol resin is preferably high. The range thereof may be a known one, and is preferably in the range of 80 g/equivalent to 200 g/equivalent, more preferably in the range of 100 g/equivalent to 180 g/equivalent, and still more preferably 110 g/equivalent to 150 g/equivalent since an adhesive force or an adhesion force may be further improved.

In addition, when these phenol resins are blended, the blending ratio thereof is not particularly limited as long as the effects of the invention are not impaired, varies depending on respective purposes, and cannot be roughly specified. For example, the blending ratio is preferably in the range of 0.1 parts by mass to 10 parts by mass, and more preferably the range of 1 part by mass to 3 parts by mass, relative to 100 parts by mass of the polyarylene sulfide resin. This range is preferred since the joining strength of the obtained composite structure can be improved.

By blending the phenol resin, the viscosity of the polyarylene sulfide resin composition can be further reduced, and the fluidity during molding can be improved, and thus the composition flows into fine unevenness portions in an adhesive surface of the metal member, and an anchor effect can be increased. Further, due to the presence of the hydroxy group, a large number of hydrogen bonds on the adhesive surface of the metal member can be formed and the adhesion force can be improved. Further, even in a high temperature and high humidity environment, the moisture can be prevented from penetrating the adhesive surface, and a high adhesive retention rate can be exhibited.

Further, in the polyarylene sulfide resin composition according to the invention, in addition to the above components, other synthetic resins other than the polyarylene sulfide resin, the thermoplastic elastomers, and the phenol resins can be appropriately blended as an optional component depending on an application. The other synthetic resins include, for example, an epoxy resin, a polyester resin, a polyamide resin, a polyimide resin, a polyetherimide resin, a polycarbonate resin, a polyphenylene ether resin, a polysulfone resin, a polyether sulfone resin, a polyether ether ketone resin, a polyether ketone resin, a polyarylene resin, a polyethylene resin, a polypropylene resin, a polytetrafluoroethylene resin, a polydifluoroethylene resin, a polystyrene resin, an ABS resin, a phenol resin, a urethane resin, and a liquid crystal polymer (hereinafter, simply referred to as synthetic resins). In the invention, the synthetic resin is not an essential component, but when blended, the blending ratio thereof is not particularly limited as long as the effects of the invention are not impaired, varies depending on the respective purposes, and cannot be roughly specified. The ratio of the resin components to be blended in the polyarylene sulfide resin composition according to the invention may be appropriately adjusted in accordance with the purpose and application such that the total of the polyarylene sulfide resin and the thermoplastic elastomers is in the range of 75.0 mass % or more and preferably in the range of 80 mass % to 99.99 mass %, that is, the synthetic resins described above are in the range of 25.0 mass % or less and preferably in the range of 0.01 mass % to 20.0 mass % within a range the effects of the invention are not impaired.

In addition, the polyarylene sulfide resin composition according to the invention may also be blended by a commonly used additive such as a colorant, an antistatic agent, an antioxidant, a heat-resistant stabilizer, an ultraviolet light stabilizer, an ultraviolet light absorber, a foaming agent, a flame retardant, a flame retardant aid, a rust inhibitor, and a coupling agent as an optional component as necessary. These additives are not essential components, but when blended, the blending ratio thereof is not particularly limited as long as the effects of the invention are not impaired, varies depending on the respective purposes, and cannot be roughly specified. For example, the blending ratio may be appropriately adjusted depending on the purpose and application in the range of 0.01 parts by mass or more to 1,000 parts by mass or less preferably, relative to 100 parts by mass of the polyarylene sulfide resin so as not to impair the effects of the invention.

In a method for producing the polyarylene sulfide resin composition according to the invention, the polyarylene sulfide resin as an essential component and other optional components as necessary are blended, and the mixture is melt-kneaded at a temperature equal to or higher than the melting point of the polyarylene sulfide resin.

In a preferred method for producing the polyarylene sulfide resin composition according to the invention, the polyarylene sulfide resin composition can be produced by a step of charging the polyarylene sulfide resin and the optional components into a ribbon blender, a Henschel mixer, a V blender, or the like in various forms such as powders, pellets, and small pieces so as to have the above-described blending ratio, dry blending the polyarylene sulfide resin and the optional components, then charging the mixture into a known melt kneading machine such as a Banbury mixer, a mixing roll, a single-screw or twin-screw extruder, or a kneader, and melt-kneading the mixture in a temperature range in which the resin temperature is the melting point of the polyarylene sulfide resin or higher, preferably in a temperature range in which the resin temperature is the melting point+10° C. or higher, more preferably in a temperature range in which the resin temperature is the melting point+10° C. to the melting point+100° C., and still more preferably in a temperature range in which the resin temperature is the melting point+20° C. to the melting point+50° C. Addition and mixing of components to the melt kneading machine may be performed at the same time or may be performed separately.

The melt kneading machine is preferably a twin-screw kneading extruder from the viewpoint of dispersibility and productivity, and for example, it is preferable to perform melt-kneading while appropriately adjusting the discharge amount of the resin component in a range of 5 to 500 (kg/hr) and the screw rotation speed in a range of 50 to 500 (rpm), and it is more preferable to perform melt-kneading under a condition in which the ratio (discharge amount/screw rotation speed) falls within a range of 0.02 to 5 (kg/hr/rpm). In addition, when a filler or an additive among the components is added, it is preferable to charge the filler or the additive into the twin-screw kneading extruder from a side feeder thereof from the viewpoint of the dispersibility. Regarding the position of the side feeder, the ratio of the distance from a resin charging unit to the side feeder of the extruder to the total length of the screws of the twin-screw kneading extruder is preferably in the range of 0.1 to 0.9. Among these, a range of 0.3 to 0.7 is particularly preferred.

The polyarylene sulfide resin composition according to the invention obtained by melt-kneading in this manner is a molten mixture containing the polyarylene sulfide resin as the essential component, the optional component added as necessary, and a derived component thereof. After the melt-kneading, the polyarylene sulfide resin composition is preferably processed into forms of pellets, chips, granules, powders, or the like, and then subjected to preliminary drying at a temperature of 100° C. to 150° C. as necessary to be subjected to various types of molding by a known method.

In the polyarylene sulfide resin composition according to the invention produced by the above-described production method, the polyarylene sulfide resin is used as the matrix, and when an optional component added as necessary is present, a morphology in which the optional component is dispersed is formed. As a result, a polyarylene sulfide resin composition excellent in impact resistance can be produced, and additional values such as high joining strength, impact resistance, and dimensional stability can be imparted to a metal-polyarylene sulfide composite structure made of a metal member and the polyarylene sulfide resin composition.

The molded article used in the invention is obtained by melt-molding the polyarylene sulfide resin composition. The melt molding may be performed by a known method, and for example, various molding methods such as injection molding, compression molding, extrusion molding of composites, sheets, and pipes, pultrusion molding, blow molding, and transfer molding can be applied, and in particular, injection molding is suitable. When the molded article is molded by the injection molding, various molding conditions are not particularly limited, and the molded article can usually be molded by a common method. For example, the molded article may be molded in an injection molding machine by injecting the polyarylene sulfide resin composition into a mold from a resin discharge port, after a step of melting the polyarylene sulfide resin composition in a temperature range in which the resin temperature is the melting point of the polyarylene sulfide resin or higher, preferably a temperature range in which the resin temperature is the melting point+10° C. or higher, more preferably a temperature range in which the resin temperature is the melting point+10° C. to the melting point+100° C., and still more preferably in a temperature range in which the resin temperature is the melting point+20° C. to the melting point+50° C. At this time, the temperature of the mold is also set to a known temperature range, for example, preferably the range of room temperature (23° C.) to 300° C., more preferably the range of 40° C. to 200° C., and most preferably the range of 120° C. to 180° C.

(Composite Structure and Production Method Therefor)

The composite structure according to the invention can be produced by a known joining method as long as the metal member (1) having the roughened surface and the resin member (2) made of the molded article obtained by melt-molding the polyarylene sulfide resin composition containing the polyarylene sulfide resin are joined in a state in which at least a portion of the roughened surface is included. For example, the composite structure according to the invention can be produced by a production method having a step (α) of joining by melt-molding the polyarylene sulfide resin composition on the surface of the metal member, or a step (β) of joining the surface of the metal member and the molded article made of the polyarylene sulfide resin composition.

The joining method (α) includes a step of joining by melt-molding the polyarylene sulfide resin composition on the surface of the metal member. Examples of the joining method (α) include a so-called metal insert molding method in which the metal member (1) is inserted into the mold of the injection molding machine, and then the polyarylene sulfide resin composition is injection-molded to the surface-roughened portion of the metal member. In addition, as another form of the metal insert molding, a so-called film insert molding may be used in which a film-shaped metal member layer is inserted into the mold, and the polyarylene sulfide resin composition is melt-molded. A device and a production method of the metal insert molding method or the film insert molding method are not particularly limited, a commercially available device can be used, and the production method may be performed according to a known method. For example, the polyarylene sulfide resin composition may be molded in the injection molding machine by injecting the polyarylene sulfide resin composition into the mold from the resin discharge port, after a step of melting the polyarylene sulfide resin composition in a temperature range in which the resin temperature is the melting point of the polyarylene sulfide resin or higher, preferably a temperature range in which the resin temperature is the melting point or higher to the melting point+100° C., and more preferably in a temperature range in which the resin temperature is the melting point+20° C. to the melting point plus 50° C. At this time, the temperature of the mold may be a known temperature range, and can be set from a lower temperature, for example, can also be set to the range of room temperature (23° C.) to 300° C., preferably the range of 40° C. to 180° C., and preferably the range of 120° C. to 180° C.

In addition, the joining method (β) includes a step of joining the surface of the metal member and the molded article made of the polyarylene sulfide resin composition. In a state in which the surface-roughened portion of the metal member (1) and the molded article obtained by melt-molding the polyarylene sulfide resin composition are brought into contact with each other, the polyarylene sulfide resin composition is heated to the melting temperature and melted, and the metal member (1) and the molded article are joined to each other.

In the joining method (β), the molded article is produced by melt-molding the polyarylene sulfide resin composition according to the invention in advance. The obtained molded article is heated and joined in a state of being in contact with the surface-roughened portion of the metal member (1), and then cooled to obtain the composite structure. Examples of such a method include a hot plate welding method, a vibration welding method, an ultrasonic welding method, a high-frequency welding method, an induction heating welding method, a rotation welding method, a laser welding method, a hot press method, and a hot embossing method. A device used in these joining methods can be a commercially available device, and a production method thereof may be performed according to a known method. For example, in the hot plate welding method, in order to melt the surface of the molded article to be welded to the metal member, the surface of the molded article is melted using a heat source such as a hot plate to satisfy the following temperature conditions, joined to the metal member, and then held in a pressurized state until being cooled and solidified. In addition, in the vibration welding, the ultrasonic welding, and the high-frequency welding, after the molded article is joined to the metal member, in order to melt the surface of the molded article to be welded to the metal member, a vibration, an ultrasonic, or a high frequency is transmitted to the molded article or the metal member to generate heat to satisfy the following temperature conditions, and the molded article is melted by the generated heat, and then held in a pressurized state until being cooled and solidified. The vibration, the high-frequency wave, and the ultrasonic wave may be transmitted by vibrating the molded article by irradiation or bringing a resonator or a vibration device into contact with the molded article, and accordingly, the molded article or the metal member per se may be caused to generate heat by the vibration or frictional heat between the molded article and the metal member. Meanwhile, in the induction heating welding, after the molded article is joined to the metal member, in order to melt the surface of the molded article to be welded to the metal member, the metal member is heated by an induction heating device to generate heat to satisfy the following temperature conditions and to melt the molded article, and the molded article is held in a pressurized state until being cooled and solidified. In addition, in the rotation welding, after the molded article and the metal member are separately held, the two are gradually brought close to each other while any of the two is rotated at a high speed in the range of 100 rpm to 4,000 rpm, and when the two are brought into contact with each other, frictional heat is generated to satisfy the following temperature conditions and to melt the resin, and then the resin is held in a pressurized state until being cooled and solidified.

In addition, the molded article made of the polyarylene sulfide resin composition may be a film-shaped article. When the molded article made of the polyarylene sulfide resin composition is a film-shaped article, from the viewpoint of maintaining the smoothness and the surface appearance property of the film-shaped article, in particular, a joining method called a hot press (thermocompression bonding) method or a melt extrusion method, which will be described below, can be used. When the film-shaped article is a transparent material capable of transmitting a laser beam, a joining method called a laser welding method also can be used.

That is, the hot press (thermocompression bonding) method or a hot embossing method is a method for thermocompression-bonding a film of the film-shaped polyarylene sulfide resin composition to the metal member under a high temperature and a high pressure. The thermocompression bonding is performed by a method using a heating roll, a hot plate pressing, or the like, and the method using a heating roll is preferred from the viewpoint of a production process.

In addition, in the case of a melt-extrusion transfer method, the polyarylene sulfide resin composition may be melted by a melt extruder and extruded into a film shape, and then pressed against a shaping roll to be cooled and solidified while being pressure-bonded to the metal member. In addition, the laser welding method can be applied in the case where the molded article can transmit a laser beam. After the molded article is joined to the metal member, the surface of the metal member is irradiated with a laser beam from a molded article side to generate heat to satisfy the following temperature conditions, and the molded article is melted and held in a pressurized state until being cooled and solidified.

On the other hand, a method for roughening the surface is limited, while the metal member may be a film-shaped article such as a metal foil. When the metal member is a film-shaped article, a so-called hot embossing method can be used in which the metal member is joined by simultaneously performing embossing and foil stamping while heating the molded article made of the polyarylene sulfide resin composition. When the hot embossing method is used, a molded article having a three-dimensional shape and a fine pattern can be produced, and when the fine pattern of the metal member is an electric circuit, a molded circuit part can be obtained.

Note that in the invention, the term "film-shaped article" generally refers to a so-called foil, film, sheet, and plate, and refers to an object having a thickness in the range of 0.001 mm to 9 mm.

In the joining method (B) described above, basically, since the molded article needs to be melted and pressure-bonded to the metal member, the heating condition is that the resin temperature may be appropriately adjusted to a temperature range in which the resin temperature is the recrystallization temperature (Tc2) of the polyarylene sulfide resin or higher, more preferably a temperature range in which the resin temperature is 240° C. or higher, and still more preferably a temperature range in which the resin temperature is 250° C. or higher. On the other hand, the upper limit value is not particularly limited as long as the resin is not decomposed, and is preferably in a temperature range in which the resin temperature is 370° C. or lower. Further, in a case where the film-shaped article or the like exhibits sufficient adhesion while maintaining excellent smoothness and appearance property, the resin temperature is preferably appropriately adjusted to a temperature range in which the resin temperature is the recrystallization temperature (Tc2) or higher and lower than the melting point. On the other hand, when it is required to exhibit more excellent adhesiveness while preventing gas generation due to the resin decomposition and preventing resin degradation, the resin temperature is preferably appropriately adjusted to a temperature range in which the resin temperature is the melting point or higher, more preferably appropriately adjusted to a temperature range in which the resin temperature is the melting point or higher to the melting point+100° C., and is particularly preferably appropriately adjusted to a temperature range in which the resin temperature is the melting point+20° C. to the melting point+50° C. In addition, pressure conditions under which the metal member and the molded article are pressure-bonded (pressed against each other) are not particularly limited as long as the joining state can be held. For example, from the start of heating to the end of cooling, in a direction in which the metal member and the resin member are pressed against each other, the pressure may be appropriately adjusted within the range of 0.01 (MPa) or more, preferably within the range of 0.01 (MPa) to 100 (MPa), and more preferably within the range of 0.1 (MPa) to 50 (MPa), in which sufficient adhesion is exhibited and the amount of burrs is small. Note that in the case of the laser welding method, it is not always necessary to press the metal member and the molded article against each other by an external force before welding, and the joining can be performed by utilizing an increased pressure generated at a joining interface due to volume expansion during melting.

(Application of Composite Structure)

Main application examples of the composite structure according to the invention can include: electric and electronic parts represented by housings for electronic equipment such as various home appliances, mobile phones, and personal computers (PCs), box-shaped protection and support members for electric and electronic part integrated modules, a plurality of individual semiconductors, modules, sensors, LED lamps, connectors, sockets, resistors, relay cases, switches, coil bobbins, capacitors, variable capacitor cases, optical pick-ups, oscillators, various terminal plates, transformers, plugs, printed boards, tuners, speakers, microphones, headphones, small type motors, magnetic head bases, power modules, terminal blocks, semiconductors, liquid crystals, FDD carriages, FDD chassis, motor brush holders, parabolic antennas, and computer related parts; home and office electric appliance parts represented by VTR parts, television parts, irons, hair dryers, rice cooker parts, electronic oven parts, acoustic parts, audio and video equipment parts such as audio laser discs, compact discs, DVD discs, and blue-ray discs, luminance parts, refrigerator parts, air conditioner parts, typewriter parts, word processor parts, or water-related equipment parts such as water heaters, hot water content and temperature sensors for a bath; mechanical parts represented by office computer related parts, telephone related parts, facsimile related parts, copier related parts, cleaning jigs, motor parts, writers, and typewriters; optical equipment and precision machine related parts represented by microscopes, binoculars, cameras, and timepieces; automobile and vehicle related parts such as alternator terminals, alternator connectors, brush holders, slip rings, IC regulators, potentiometer bases for light dimmer, relay blocks, inhibitor switches, various valves such as an exhaust gas valve, various pipes for fuel, exhaust, and intake systems, air intake nozzle snorkels, intake manifolds, fuel pumps, engine cooling water joints, carburetor main bodies, carburetor spacers, exhaust gas sensors, cooling water sensors, oil temperature sensors, brake pad wear sensors, throttle position sensors, crank shaft position sensors, air flow meters, brake pad abrasion sensors, air conditioner thermostat bases, warming hot air flow control valves, radiator motor brush holders, water pump impellers, turbine vanes, wiper motor related parts, distributors, starter switches, ignition coils and bobbins thereof, motor insulators, motor rotors, motor cores, starter relays, transmission wire harnesses, window washer nozzles, air conditioner panel switch boards, fuel related electromagnetic valve coils, fuse connectors, horn terminals, electrical part insulating plates, step motor rotors, lamp sockets, lamp reflectors, lamp housings, brake pistons, solenoid bobbins, engine oil filters, initiator cases, power modules, inverters, power devices, intelligent power modules, insulated gate bipolar transistors, power control units, reactors, converters, capacitors, insulators, motor terminal blocks, batteries, electric compressors, battery current sensors, junction blocks, and cases for storing DLI system ignition coils; and other applications.

EXAMPLES

Hereinafter, the invention will be described in more detail with reference to specific examples. Unless otherwise specified, parts and % are based on mass.

Measurement Examples

[Measurement Example 1] Measurement of Melt Viscosity of Polyphenylene Sulfide Resin The melt viscosity of the polyphenylene sulfide resin was measured using a Koka flow tester (CFT-500D, manufactured by Shimadzu Corporation) after holding at 300° C., a load of $1.96 \times 10^6$ Pa, and L/D=10 (mm)/1 (mm) for 6 minutes.

[Measurement Example 2] Measurement of Melt Viscosity of Polyphenylene Sulfide Resin Composition The melt viscosity of the polyphenylene sulfide resin composition was measured using a Capilograph (Capilograph 1D, manufactured by Toyo Seiki Seisaku-sho, Ltd.) after a sample was charged and then held for 6 minutes, and using an orifice length (L) of 40 mm and an orifice diameter (D) of 1 may (L/D=40) at 300° C. under conditions of a shear rate of 12/sec and 1200/sec.

[Measurement Example 3 (Measurement of Pore Distribution, Maximum Value, and Cumulative Pore Volume of Pore Diameter in Range of 0.1 μm to 20 μm in Roughened Surface)]

In order to avoid measurement defects due to amalgam formation, a gold sputtering treatment having a film thickness of 40 nm was performed as a pretreatment on the entire surface of a measurement sample, the measurement sample was further dried at 110° C. and normal pressure for 1 hour or longer, and then vacuum degassing was performed at normal temperature and 0.1 kPa for 5 minutes. A cell was filled with 50 measurement samples after the pretreatment, and a cumulative pore volume V (mL/g) and a pore distribution dV/dlog D (ml/g) of an evaluation sample having a pore diameter D in the range of 0.1 μm to 100 μm were measured under the condition of a measurement temperature of 25° C. (evaluated at a surface tension of mercury of 480 mN/m and a contact angle with mercury of 141.3 deg) by using a mercury porosimeter (product name: PASCAL 240, PASCAL 140, manufactured by MicrotracBEL Corporation) in accordance with the mercury porosimetry (JIS R 1655-2003). The cumulative pore volume V was multiplied by the true density of the sample, and the projection area ratio of the bulk volume of a test piece to the roughened portion (that is, the apparent area ratio without considering the roughened unevenness) was multiplied to calculate a cumulative pore specific volume V' (nL/mm$^2$) per unit roughened area. The cumulative pore volume of the pore diameter in the range of 0.1 μm to 20 μm per unit roughened area of the test piece was calculated based on the V'. In addition, the pore diameter in which the pore distribution dV/dlog D shows the maximum value of the pore diameter in the range of 1 μm to 20 μm was determined.

[Measurement Example 4 (Measurement of Cumulative Pore Volume and Pore Distribution of Pore Diameter Less Than 0.1 μm in Roughened Surface)]

To a sample tube, 40 samples were placed, and in order to remove volatile components contained in the samples, a degassing treatment (atmospheric pressure: 0.01 kPa or less, 100° C.×2 hours+200° C.×1 hour) was performed under a reduced pressure using a vacuum heating pretreatment device (product name: BELPREP-vacII, manufactured by MicrotracBEL Corporation). The samples after the degassing treatment were attached to a measurement unit of a gas adsorption amount measurement device (product name: BELSORP-max, manufactured by MicrotracBEL Corporation), the gas adsorption amount to the sample when the nitrogen gas was introduced into the sample tube while changing the relative pressure was measured in accordance with the specific surface area measurement method (JIS R 8830-2013), and the cumulative pore volume and the pore distribution of the pore diameter less than 0.1 μm were determined by a DH method based on the adsorption property at a relative pressure of 0.44 to 1.0.

[Measurement Example 5] Measurement of Joining Strength of Composite Structure

The shear tensile of the composite structure (Type-B according to ISO 19095) was measured using a material tester (AG-IS, manufactured by Shimadzu Corporation) at a tensile rate of 5 mm/min. The measurement temperature was room temperature, and an average value (n=4) of maximum values of stress until the composite structure was broken was defined as the joining strength.

[Measurement Example 6] Heat Cycle Test (Heat Cycle Resistance) of Composite Structure The composite structure (Type-B according to ISO 19095) was introduced into a cooling and heating shock tester ("TSA-103EL" manufactured by ESPEC Corporation), and 100 cycles of a heat cycle of −40° C./30 minutes to 160° C./30 minutes were performed (one cycle one hour). The composite structure after the heat cycle test was subjected to a "shear tensile test" according to Measurement Example 4 to obtain the joining strength after the heat cycle test. The joining strength before the heat cycle test was used as "initial joining strength", and "(joining strength after heat cycle test)/(joining strength before heat cycle test)×100" was used as a retention rate (%). The higher the retention rate is, the more excellent the heat cycle resistance is.

[Measurement Example 7] Tensile Fatigue Test of Composite Structure

The composite structure (Type-A according to ISO 19095) was subjected to a pulsating stress test in a tensile test mode at a frequency of 20 Hz at room temperature (according to JIS K-7118) using a material tester (servo pulser, manufactured by Shimadzu Corporation), and the number of amplitude cycles until the material was broken was measured. Ten or more points were measured while changing the condition i.e., the stress amplitude value, and an S-N diagram was created by a least squares method based on logarithmic value results of the stress amplitude and the number of amplitude cycles until breakage. The stress amplitude value corresponding to 10,000 times amplitude breakage was determined based on the obtained S-N diagram.

[Measurement Example 8] Sealing Property Test of Composite Structure

The composite structure (Type-D2.1 according to ISO 19095) was installed as a cover of a metal sealed container (internal volume: 61 cm$^3$), and was applied with an air pressure of 1 MPa in the sealed state. The composite structure is held at room temperature for 24 hours to measure the retention rate of the pressure.

[Measurement Example 9] Melting Point and Recrystallization Temperature of Resin Member A temperature showing the maximum endothermic peak when the temperature was raised from room temperature to 350° C. at 20° C./min was measured as the melting point (Tm) and a temperature showing the maximum exothermic peak when the temperature was lowered from a molten state at 20° C./min was measured as the recrystallization temperature (Tc2), which were measured using a differential scanning calorimeter (PYRIS Diamond DSC manufactured by PerkinElmer Inc.) and based on an analysis method by a differential scanning calorimeter (DSC method, according to JIS K-7121).

<Production Example 1> Production of Polyphenylene Sulfide Resin (1)

[Step 1]

A 150-liter autoclave with stirring blades to which a pressure gauge, a thermometer, a condenser, a decanter, and a fractionation column were connected was charged with 33.075 parts by mass (225 parts by mol) of p-dichlorobenzene (hereinafter, abbreviated as "p-DCB"), 3.420 parts by mass (34.5 parts by mol) of NMP, 27.300 parts by mass (230 parts by mol in terms of NaSH) of a 47.23 mass % NaSH aqueous solution, and 18.533 parts by mass (228 parts by mol in terms of NaOH) of a 49.21 mass % NaOH aqueous solution, the temperature was raised to 173° C. over 5 hours under a nitrogen atmosphere while stirring the mixture to distill off 27.300 parts by mass of water, and then the autoclave was sealed. p-DCB distilled off by azeotropy during dehydration was separated with the decanter and returned to the autoclave as needed. The inside of the autoclave after the completion of the dehydration was in a state in which an anhydrous sodium sulfide composition in the form of fine particles was dispersed in p-DCB. Since the content of NMP in the composition was 0.079 parts by mass (0.8 parts by mol), it was shown that 98 mol % (33.7 parts by mol) of the charged NMP was hydrolyzed into a sodium salt of a ring-opened body (4-(methylamino)butyric acid) of NMP (hereinafter abbreviated as "SMAB"). The amount of SMAB in the autoclave was 0.147 parts by mol per mol of sulfur atoms present in the autoclave. The theoretical dehydration amount was 27.921 parts by mass when the total amount of the charged NaSH and NaOH was changed to anhydrous Na2S, and thus it was shown that 0.609 parts by mass (33.8 parts by mol) in 0.878 parts by mass (48.8 parts by mol) of the remaining water amount in the autoclave was consumed in the hydrolysis reaction of NMP and NaOH and was not present in the autoclave as water, and the remaining 0.269 parts by mass (14.9 parts by mol) remained in the autoclave in the form of water or crystal water. The moisture content in the autoclave was 0.065 mol per mol of the sulfur atoms present in the autoclave.

[Step 2]

After the completion of the dehydration step, the internal temperature was cooled to 160° C., 46.343 parts by mass (467.5 parts by mol) of NMP was charged, and the temperature was raised to 185° C. The moisture content in the autoclave was 0.025 mol per mol of NMP charged at step 2. When the gauge pressure reached 0.00 Mpa, the valve to which the fractionation column was connected was open, and the temperature was raised to the internal temperature of 200° C. over 1 hour. At this time, the temperature at an outlet of the fractionation column was controlled to be 110° C. or lower by cooling and the valve opening degree. A mixed vapor of the distilled p-DCB and water was condensed with the condenser and separated with the decanter, and p-DCB was returned to the autoclave. The amount of the distilled water was 0.228 parts by mass (12.7 parts by mol).

[Step 3]

The moisture content in the autoclave at the start of step 3 was 0.041 parts by mass (2.3 parts by mol), 0.005 mol per mol of NMP charged in step 2, and 0.010 mol per mol of the sulfur atoms present in the autoclave. The amount of SMAB in the autoclave was the same as that in step 1, and was 0.147 mol per mol of the sulfur atoms present in the autoclave. Next, the temperature was raised from the internal temperature of 200° C. to 230° C. over 3 hours, the mixture was stirred for 1 hour at 230° C., then the temperature was raised to 250° C., and the mixture was stirred for 1 hour. The gauge pressure at the internal temperature of 200° C. was 0.03 MPa, and the final gauge pressure was 0.40 MPa. After cooling, 0.650 parts by mass of the obtained slurry was poured into 3 parts by mass (3 parts by liter) of water, and the mixture was stirred at 80° C. for 1 hour and then filtered. The cake was again stirred with 3 parts by mass (3 parts by liter) of warm water for 1 hour, washed, and then filtered. The operation was repeated four times. The cake was again added with 3 parts by mass (3 parts by liter) of warm water and acetic acid, adjusted to a pH of 4.0, then stirred for 1 hour and washed, and then filtered. The cake was again stirred with 3 parts by mass (3 parts by liter) of warm water for 1 hour, washed, and then filtered. The operation was repeated twice. The cake was dried overnight at 120° C. using a hot air dryer to obtain a white powdery PPS resin (A). The melt viscosity at 300° C. of the polymer was 56 Pa·s. The non-Newtonian index was 1.07.

<Production Example 2> Production of Polyphenylene Sulfide Resin (2)

[Step 1]

A 150-liter autoclave with stirring blades to which a pressure gauge, a thermometer, a condenser, a decanter, and a fractionation column were connected was charged with 35.868 parts by mass (244 parts by mol) of p-dichlorobenzene, 3.420 parts by mass (34.5 parts by mol) of NMP, 27.300 parts by mass (230 parts by mol in terms of NaSH) of a 47.23 mass % NaSH aqueous solution, and 18.533 parts by mass (228 parts by mol in terms of NaOH) of a 49.21 mass % NaOH aqueous solution, the temperature was raised to 173° C. over 5 hours under a nitrogen atmosphere while stirring the mixture to distill off 27.300 parts by mass of water, and then the autoclave was sealed. p-DCB distilled off by azeotropy during dehydration was separated with the decanter and returned to the autoclave as needed. The inside of the autoclave after the completion of the dehydration was in a state in which an anhydrous sodium sulfide composition in the form of fine particles was dispersed in p-DCB. Since the content of NMP in the composition was 0.079 parts by mass (0.8 parts by mol), it was shown that 98 mol % (33.7 parts by mol) of the charged NMP was hydrolyzed into a sodium salt of a ring-opened body (4-(methylamino)butyric acid) of NMP (hereinafter abbreviated as "SMAB"). The amount of SMAB in the autoclave was 0.147 parts by mol per mol of sulfur atoms present in the autoclave. The theoretical dehydration amount was 27.921 parts by mass when the total amount of the charged NaSH and NaOH was changed to anhydrous Na2S, and thus it was shown that 0.609 parts by mass (33.8 parts by mol) in 0.878 parts by mass (48.8 parts by mol) of the remaining water amount in the autoclave was consumed in the hydrolysis reaction of NMP and NaOH and was not present in the autoclave as water, and the remaining 0.269 parts by mass (14.9 parts by mol) remained in the autoclave in the form of water or crystal water. The moisture content in the autoclave was 0.065 mol per mol of the sulfur atoms present in the autoclave.

[Step 2]

After the completion of the dehydration step, the internal temperature was cooled to 160° C., 46.343 parts by mass (467.5 parts by mol) of NMP was charged, and the temperature was raised to 185° C. The moisture content in the autoclave was 0.025 mol per mol of NMP charged at step 2. When the gauge pressure reached 0.00 Mpa, the valve to which the fractionation column was connected was open, and the temperature was raised to the internal temperature of 200° C. over 1 hour. At this time, the temperature at an outlet of the fractionation column was controlled to be 110° C. or lower by cooling and the valve opening degree. A mixed vapor of the distilled p-DCB and water was condensed with the condenser and separated with the decanter, and p-DCB was returned to the autoclave. The amount of the distilled water was 0.228 parts by mass (12.7 parts by mol).

[Step 3]

The moisture content in the autoclave at the start of step 3 was 0.041 parts by mass (2.3 parts by mol), 0.005 mol per mol of NMP charged in step 2, and 0.010 mol per mol of the sulfur atoms present in the autoclave. The amount of SMAB in the autoclave was the same as that in step 1, and was 0.147 mol per mol of the sulfur atoms present in the autoclave. Next, the temperature was raised from the internal temperature of 200° C. to 230° C. over 3 hours, the mixture was stirred for 1 hour at 230° C., and then the temperature was raised to 250° C., and the mixture was stirred for 1 hour. The gauge pressure at the internal temperature of 200° C. was 0.03 MPa, and the final gauge pressure was 0.40 MPa. After cooling, 0.650 parts by mass of the obtained slurry was poured into 3 parts by mass (3 parts by liter) of water, and the mixture was stirred at 80° C. for 1 hour and then filtered. The cake was again stirred with 3 parts by mass (3 parts by liter) of warm water for 1 hour, washed, and then filtered. The operation was repeated four times. The cake was again added with 3 parts by mass (3 parts by liter) of warm water and acetic acid, adjusted to a pH of 4.0, then stirred for 1 hour and washed, and then filtered. The cake was again stirred with 3 parts by mass (3 parts by liter) of warm water for 1 hour, washed, and then filtered. The operation was repeated twice. The cake was dried overnight at 120° C. using a hot air dryer to obtain a white powdery PPS resin (A). The melt viscosity at 300° C. of the polymer was 7 Pa·s. The non-Newtonian index was 1.07.

<Production Example 3> Production of Polyphenylene Sulfide Resin (3)

[Step 1]

A 150-liter autoclave with stirring blades to which a pressure gauge, a thermometer, a condenser, a decanter, and a fractionation column were connected was charged with 33.222 parts by mass (226 parts by mol) of p-dichlorobenzene (hereinafter, abbreviated to as "p-DCB"), 3.420 parts by mass (34.5 parts by mol) of NMP, 27.300 parts by mass (230 parts by mol in terms of NaSH) of a 47.23 mass % NaSH aqueous solution, and 18.533 parts by mass (228 parts by mol in terms of NaOH) of a 49.21 mass % NaOH aqueous solution, the temperature was raised to 173° C. over 5 hours under a nitrogen atmosphere while stirring the mixture to distill off 27.300 parts by mass of water, and then the autoclave was sealed. p-DCB distilled off by azeotropy during dehydration was separated with the decanter and returned to the autoclave as needed. The inside of the autoclave after the completion of the dehydration was in a state in which an anhydrous sodium sulfide composition in the form of fine particles was dispersed in p-DCB. Since the content of NMP in the composition was 0.079 parts by mass (0.8 parts by mol), it was shown that 98 mol % (33.7 parts by mol) of the charged NMP was hydrolyzed into a sodium salt of a ring-opened body (4-(methylamino)butyric acid) of NMP (hereinafter abbreviated as "SMAB"). The amount of SMAB in the autoclave was 0.147 parts by mol per mol of sulfur atoms present in the autoclave. The theoretical dehydration amount was 27.921 parts by mass when the total amount of the charged NaSH and NaOH was changed to anhydrous Na2S, and thus it was shown that 0.609 parts by mass (33.8 parts by mol) in 0.878 parts by mass (48.8 parts by mol) of the remaining water amount in the autoclave was consumed in the hydrolysis reaction of NMP and NaOH and was not present in the autoclave as water, and the remaining 0.269 parts by mass (14.9 parts by mol) remained in the autoclave in the form of water or crystal water. The moisture content in the autoclave was 0.065 mol per mol of the sulfur atoms present in the autoclave.

[Step 2]

After the completion of the dehydration step, the internal temperature was cooled to 160° C., 46.343 parts by mass (467.5 parts by mol) of NMP was charged, and the temperature was raised to 185° C. The moisture content in the autoclave was 0.025 mol per mol of NMP charged at step 2. When the gauge pressure reached 0.00 Mpa, the valve to which the fractionation column was connected was open, and the temperature was raised to the internal temperature of 200° C. over 1 hour. At this time, the temperature at an outlet of the fractionation column was controlled to be 110° C. or lower by cooling and the valve opening degree. A mixed vapor of the distilled p-DCB and water was condensed with the condenser and separated with the decanter, and p-DCB was returned to the autoclave. The amount of the distilled water was 0.228 parts by mass (12.7 parts by mol).

[Step 3]

The moisture content in the autoclave at the start of step 3 was 0.041 parts by mass (2.3 parts by mol), 0.005 mol per mol of NMP charged in step 2, and 0.010 mol per mol of the sulfur atoms present in the autoclave. The amount of SMAB in the autoclave was the same as that in step 1, and was 0.147 mol per mol of the sulfur atoms present in the autoclave. Next, the temperature was raised from the internal temperature of 200° C. to 230° C. over 3 hours, the mixture was stirred for 3 hours at 230° C., then the temperature was raised to 250° C., and the mixture was stirred for 1 hour. The gauge pressure at the internal temperature of 200° C. was 0.03 MPa, and the final gauge pressure was 0.40 MPa. After cooling, 0.650 parts by mass of the obtained slurry was poured into 3 parts by mass (3 parts by liter) of water, and the mixture was stirred at 80° C. for 1 hour and then filtered. The cake was again stirred with 3 parts by mass (3 parts by liter) of warm water for 1 hour, washed, and then filtered. The operation was repeated four times. The cake was again added with 3 part by mass (3 parts by liter) of warm water and acetic acid, adjusted to a pH of 4.0, then stirred for 1 hour and washed, and then filtered. The cake was again stirred with 3 parts by mass (3 parts by liter) of warm water for 1 hour, washed, and then filtered. The operation was repeated twice. The cake was dried overnight at 120° C. using a hot air dryer to obtain a white powdery PPS resin (A). The melt viscosity at 300° C. of the polymer was 180 Pa·s. The non-Newtonian index was 1.07.

<Production Example 4> Production of Polyphenylene Sulfide Resin (4)

A 150-liter autoclave with stirring blades and a bottom valve to which a pressure gauge, a thermometer, and a condenser were connected was charged with 19.413 parts by mass (60.3 mass % in terms of Na2S) of flaky sodium sulfide and 45.000 parts by mass of NMP. The temperature was raised to 209° C. while stirring under a nitrogen stream to distill off 4.644 parts by mass of water (the remaining moisture content was 1.13 mol per mol of sodium sulfide). Thereafter, the autoclave was sealed and cooled to 180° C., and 22.05 parts by mass of paradichlorobenzene and 18.000 parts by mass of NMP were charged. The gauge pressure was raised to 0.1 MPa using a nitrogen gas under a liquid temperature of 150° C. to start the temperature rise. The reaction proceeded while stirring at the liquid temperature of 260° C. for 3 hours, and an upper portion of the autoclave was cooled by spraying water. Next, the temperature was lowered, and cooling of the upper portion of the autoclave was stopped. During the cooling of the upper portion of the autoclave, the liquid temperature was held constant so as not to drop. The maximum pressure during the reaction was 0.85 MPa.

After the reaction, the autoclave was cooled. After cooling, 0.650 parts by mass of the obtained slurry was poured into 3 parts by mass (3 parts by liter) of water, stirred at 80° C. for 1 hour, and then filtered. The cake was again stirred with 3 parts by mass (3 parts by liter) of warm water for 1 hour, washed, and then filtered. The operation was repeated seven times. The cake was dried overnight at 120° C. using a hot air dryer. Thereafter, the cake was heat-treated by a hot air dryer at 250° C. for 3 hours to obtain a PPS resin (4). The melt viscosity of the obtained polymer was 700 Pa·s, and the non-Newtonian index was 1.60.

<Production Example 5> Production of Polyphenylene Sulfide Resin Composition (A-1)

The polyphenylene sulfide resin (1) produced above and respective materials were uniformly mixed in a tumbler according to composition components and blending amounts (all parts by mass) shown in Table 1. Thereafter, the blending materials were charged into a vented twin-screw extruder (TEX30α, manufactured by The Japan Steel Works, LTD.) and melt-kneaded by setting the resin component discharge amount to 30 kg/hr, the screw rotation speed to 220 rpm, and the set resin temperature to 320° C. to obtain pellets of a polyphenylene sulfide resin composition (A-1). The melt viscosity of the obtained polyphenylene sulfide resin composition (A-1) was 1500 Pa·s (shear rate: 12/sec, 300° C.) and 240 Pa·s (shear rate: 1200/sec, 300° C.). Similarly, according to the composition components and blending amounts shown in Table 1, respective materials were mixed and then melt-kneaded to obtain pellets of polyphenylene sulfide resin compositions (A-2 to A-6).

<Production Example 6> Production of Metal Member (B-0)

Untreated (unroughened) plates made of aluminum diecast (ADC12), aluminum (A5052), and copper (C1100) were cut out to dimensions according to various evaluation tests and subjected to the tests. For the measurement of the pore distribution, the maximum value, and the cumulative pore volume, a metal member having a size of length×width×thickness=10.0 mm×6.0 mm×1.5 mm was used. In the joining strength test and the heat cycle test, a metal member having a size of length×width×thickness=10.0 mm×45.0 mm×1.5 mm in accordance with Type-B of ISO 19095 was used. In the tensile fatigue test, a metal member having a size of length×width×thickness=10.0 mm×50.0 mm×2.0 mm in accordance with Type-A of ISO 19095 was used. In the sealing property test, a hollow disc-shaped metal member having an outer diameter/inner diameter×thickness=70.0 mm/20.0 mm×2.0 mm in accordance with Type-D2.1 of ISO 19095 was used.

<Production Example 7> Production of Metal Member (Surface Roughened B-1)

The metal member (B-0) made of ADC12 was immersed in a 5% sodium hydroxide aqueous solution at 50° C. for 30 seconds to perform a first surface roughening step. Next, as a second surface roughening step, the metal member (B-0) was immersed in an erosive aqueous solution mixed at a volume ratio of 67.5% nitric acid:55% hydrofluoric acid=9:1 for 30 seconds to obtain a metal member (B-1).

<Production Example 8> Production of Metal Member (B-2)

The metal pieces (B-0) made of ADC12 and A5052 were subjected to a D process treatment from MEC CO., LTD., and the metal piece (B-0) made of C1110 was subjected to an A-10201 treatment from the same corporation to obtain a metal member (B-2).

<Production Example 9> Production of Metal Member (B-3)

The metal member (B-0) made of ADC12 was immersed in a 5% sodium hydroxide aqueous solution at 50° C. for 20 seconds to perform surface roughening, and a metal member (B-3) was obtained.

<Production Example 10> Production of Metal Member (B-4)

The metal member (B-0) made of ADC12 was immersed in a 2% sodium hydroxide aqueous solution at 50° C. for 20 seconds to perform a first surface roughening step. Next, the metal member (B-0) was immersed in an erosive aqueous solution mixed at a volume ratio of 15% nitric acid:10% hydrofluoric acid=9:1 for 20 seconds to perform a second surface roughening step, and a metal member (B-4) was obtained.

<Production Example 11> Production of Metal Member (B-5)

The metal member (B-0) made of ADC12 was immersed in a 5% sodium hydroxide aqueous solution at 50° C. for 10 seconds to perform a first surface roughening step. Next, the metal member (B-0) was immersed in an erosive aqueous solution mixed at a volume ratio of 67.5% nitric acid:55% hydrofluoric acid=9:1 for 10 seconds to perform a second surface roughening step, and a metal member (B-5) was obtained.

<Production Example 12> Production of Metal Member (Surface Roughened B-6)

The metal member (B-0) made of ADC12 was subjected to an alumite treatment by an anodic oxidation method to obtain a metal member (B-6) without performing a sealing treatment.

<Production Example 13> Production of Metal Member (B-7)

After the metal member (B-0) made of ADC12 was subjected to shot blasting by a steel grid abrasive for 60 seconds, a D process treatment from MEC CO., LTD. was performed in the same manner as in Production Example 8, to obtain a metal member (B-7).

[Production of Composite Structure]

The composite structure was prepared by insert molding using an injection molding machine (SV-50M, manufactured by Sumitomo Heavy Industries, Ltd.). That is, each of the metal members (B-0 to B-7) obtained in Production Examples 6 to 13 described above was preheated to 200° C. on a hot plate, and then inserted into a mold (mold temperature: 140° C.) installed in the injection molding machine, and subsequently, each of the molten polyphenylene sulfide resin compositions (A-1 to A-6) was quickly injected into the mold, thereby obtaining the composite structure in which the metal member and the polyphenylene sulfide resin composition were integrated to each other. At this time, the barrel temperature of the molding machine was 320° C., the injection rate was 50 mm/sec, and the pressure retention was 50 MPa. The obtained composite structure was annealed at 160° C. for 100 hours, and the joining strength, the retention rate, the tensile fatigue test, and the sealing properties were evaluated according to Measurement Examples 1 to 9.

Evaluation results are shown in Table 2. Note that in Table 2, the item "pore volume (0.1 μm to 20 μm)" means a pore volume of a pore distribution having a pore diameter in the range of 0.1 μm to 20 μm, and the item "pore volume (2 nm to 0.1 μm)" means a pore volume of a pore distribution having a pore diameter in the range of 2 nm to 0.1 μm. In addition, in Table 2, the item "maximum value of pore volume" means the maximum value in the pore distribution having the pore diameter in the range of 0.1 μm to 20 μm. In addition, the blending ratio of the polyphenylene sulfide resin composition in the table represents part by mass, and the following materials are used.

Glass fiber: chopped strand fiber having a length of 200 μm and an average diameter of 10 μm Elastomer: "Bondfast-7L" (ethylene-glycidyldimethacrylate-vinyl acetate) manufactured by Sumitomo Chemical Co., Ltd.

Silane coupling agent: 3-glycidoxypropyltrimethoxysilane "SH-6040" manufactured by Dow Corning Corp.

TABLE 1

| PPS resin composition | Viscosity | A-1 | A-2 | A-3 | A-4 | A-5 | A-6 |
|---|---|---|---|---|---|---|---|
| PPS resin (1) | 56 Pa·s | 59.7 | 64.7 | 99.7 | | | |
| PPS resin (2) | 7 Pa·s | | | | 59.7 | | |
| PPS resin (3) | 180 Pa·s | | | | | 59.7 | |
| PPS resin (4) | 700 Pa·s | | | | | | 59.7 |
| Glass fiber | | 40 | 30 | | 40 | 40 | 40 |
| Elastomer | | | 5 | | | | |
| Silane coupling agent | | 0.3 | 0.3 | 0.3 | 0.3 | 0.3 | 0.3 |
| Melt viscosity (300° C.) | 12/s | 1500 | 1200 | 250 | 700 | 2800 | 8000 |
| | 1200/s | 240 | 220 | 80 | 90 | 500 | 900 |

TABLE 2

| | | Unit | Example 1 | Example 2 | Example 3 | Example 4 | Example 5 | Example 6 | Example 7 | Example 8 | Example 9 |
|---|---|---|---|---|---|---|---|---|---|---|---|
| PPS resin composition | | | A-1 | A-1 | A-2 | A-1 | A-1 | A-3 | A-4 | A-5 | A-6 |
| Metal member | | | ADC12 | ADC12 | ADC12 | A5052 | C1100 | ADC12 | ADC12 | ADC12 | ADC12 |
| Surface roughened metal | | | B-1 | B-2 | B-1 | B-2 | B-2 | B-1 | B-1 | B-1 | B-1 |
| Metal member | Cumulative pore volume (0.1 μm to 20 μm) | nL/mm² | 1 | 1.2 | 1 | 1.2 | 1.2 | 1 | 1 | 1 | 1 |
| | Cumulative pore volume (less than 0.1 μm) | nL/mm² | 0 | 0 | 0 | 0 | 0 | 0 | 0 | 0 | 0 |
| | Maximum value of pore diameter | μm | 2.0 | 0.5 | 2.0 | 0.5 | 0.5 | 2.0 | 2.0 | 2.0 | 2.0 |
| Joining strength | | MPa | 45 | 35 | 48 | 33 | 31 | 49 | 39 | 44 | 29 |
| Heat cycle resistance | | MPa | 40 | 32 | 48 | 30 | 28 | 40 | 35 | 40 | 22 |
| | | Retention rate | 89% | 91% | 100% | 91% | 90% | 82% | 90% | 91% | 76% |
| Tensile fatigue test (10,000 times of durable load) | | MPa | 16 | 11 | 19 | 11 | 10 | 18 | 15 | 17 | 10 |
| Sealing property (1 MPa, airtight retention rate) | | | 99 | 97 | 100 | 98 | 96 | 98 | 97 | 96 | 88 |

| | Unit | Comparative Example 1 | Comparative Example 2 | Comparative Example 3 | Comparative Example 4 | Comparative Example 5 | Comparative Example 6 |
|---|---|---|---|---|---|---|---|
| PPS resin composition | | A-1 | A-1 | A-1 | A-1 | A-1 | A-1 |
| Metal member | | ADC12 | ADC12 | ADC12 | ADC12 | ADC12 | ADC12 |
| Surface roughened metal | | B-0 | B-6 | B-3 | B-4 | B-5 | B-7 |

TABLE 2-continued

|  |  |  |  |  |  |  |  |  |
|---|---|---|---|---|---|---|---|---|
| Metal member | Cumulative pore volume (0.1 μm to 20 μm) | nL/mm² | 0.1 | 0.3 | 0.3 | 0.2 | 0.3 | 6.5 |
|  | Cumulative pore volume (less than 0.1 μm) | nL/mm² | 0 | 41 | 2 | 0 | 1 | 5 |
|  | Maximum value of pore diameter | μm | None | None | 1.5 | 1.0 | 1.2 | 9.0 |
| Joining strength |  | MPa | NG | 11 | 18 | 8 | 20 | 22 |
| Heat cycle resistance |  | MPa | NG | 8 | 12 | NG | 14 | 17 |
|  |  | Retention rate | 0% | 73% | 67% | 0% | 70% | 77% |
| Tensile fatigue test (10,000 times of durable load) |  | MPa | — | NG | 5 | NG | 5 | 8 |
| Sealing property (1 MPa, airtight retention rate) |  |  | 0 | 0 | 0 | 0 | 0 | 50 |

The invention claimed is:

1. A composite structure in which a metal member having a roughened surface and a resin member are joined in a state in which at least a portion of the roughened surface is included, wherein
the resin member is made of a molded article obtained by melt-molding a polyarylene sulfide resin composition containing a polyarylene sulfide resin (A),
in the roughened surface, a cumulative pore volume of a pore diameter in a range of 0.1 μm to 20 μm is in a range of 0.5 nL/mm² or more and 5 nL/mm² or less measured by mercury porosimetry,
the roughened surface has a pore diameter of 5 μm or less in which a pore distribution shows a maximum value in the pore diameter in the range of 0.1 μm to 20 μm measured by the mercury porosimetry, and
the polyarylene sulfide resin (A) has a melt viscosity in a range of 5 Pa's or more and 500 Pa's or less, wherein the melt is viscosity measured using a Koka flow tester after being held at 300° C., a load of 1.96×106 Pa, and L/D=10 (mm)/1 (mm) for 6 minutes.

2. The composite structure according to claim 1, wherein the roughened surface has a cumulative pore volume of less than 10 nL/mm² measured by a nitrogen gas adsorption method.

3. The composite structure according to claim 2, wherein the polyarylene sulfide resin composition has a melt viscosity at 300° C. in a range of 100 Pa·s or more and 7000 Pa·s or less at a shear rate of 12/s and in a range of 40 Pa·s or more to 800 Pa·s or less at a shear rate of 1200/s.

4. The composite structure according to claim 2, wherein the polyarylene sulfide resin composition is obtained by blending a filler (B) in a range of 1 part by mass to 150 parts by mass relative to 100 parts by mass of the polyarylene sulfide resin (A) and melt-kneading the mixture.

5. The composite structure according to claim 2, wherein the polyarylene sulfide resin composition is obtained by blending an elastomer (C) in a range of 0.01 parts by mass to 30 parts by mass relative to 100 parts by mass of the polyarylene sulfide resin (A) and melt-kneading the mixture.

6. The composite structure according to claim 2, wherein the polyarylene sulfide resin composition is obtained by blending a silane coupling agent (D) in a range of 0.01 parts by mass to 5 parts by mass relative to 100 parts by mass of the polyarylene sulfide resin (A) and melt-kneading the mixture.

7. The composite structure according to claim 1, wherein the polyarylene sulfide resin composition has a melt viscosity at 300° C. in a range of 100 Pa·s or more and 7000 Pa·s or less at a shear rate of 12/s and in a range of 40 Pa·s or more to 800 Pa·s or less at a shear rate of 1200/s.

8. The composite structure according to claim 1, wherein the polyarylene sulfide resin composition is obtained by blending a filler (B) in a range of 1 part by mass to 150 parts by mass relative to 100 parts by mass of the polyarylene sulfide resin (A) and melt-kneading the mixture.

9. The composite structure according to claim 1, wherein the polyarylene sulfide resin composition is obtained by blending an elastomer (C) in a range of 0.01 parts by mass to 30 parts by mass relative to 100 parts by mass of the polyarylene sulfide resin (A) and melt-kneading the mixture.

10. The composite structure according to claim 1, wherein the polyarylene sulfide resin composition is obtained by blending a silane coupling agent (D) in a range of 0.01 parts by mass to 5 parts by mass relative to 100 parts by mass of the polyarylene sulfide resin (A) and melt-kneading the mixture.

11. A method for producing a composite structure in which a metal member having a roughened surface and a resin member are joined in a state in which at least a portion of the roughened surface is included, the resin member being made of a molded article obtained by melt-molding a polyarylene sulfide resin composition containing a polyarylene sulfide resin, the method comprising:
a step (α) of joining by melt-molding the polyarylene sulfide resin composition on a surface of the metal member, or a step (β) of joining the surface of the metal member and the molded article, wherein
in the roughened surface, a cumulative pore volume of a pore diameter in a range of 0.1 μm to 20 μm is in a range of 0.5 nL/mm² or more and 5 nL/mm² or less measured by mercury porosimetry, the roughened surface has a pore diameter of 5 μm or less in which a pore distribution shows a maximum value in the pore diameter in the range of 0.1 μm to 20 μm measured by the mercury porosimetry, and the polyarylene sulfide resin has a melt viscosity in a range of 5 Pa·s or more and 500 Pa's or less, wherein the melt is viscosity measured using a Koka flow tester after being held at 300° C., a load of 1.96×106 Pa, and L/D=10 (mm)/1 (mm) for 6 minutes.

12. The method for producing a composite structure according to claim 11, wherein the roughened surface has a cumulative pore volume of less than 10 $nL/mm^2$ measured by a nitrogen gas adsorption method.

* * * * *